US008288757B2

(12) United States Patent
Ohta et al.

(10) Patent No.: US 8,288,757 B2
(45) Date of Patent: Oct. 16, 2012

(54) SEMICONDUCTOR DEVICE AND MANUFACTURING METHOD THEREOF

(75) Inventors: Hiroyuki Ohta, Kokubunji (JP); Yosuke Shimamune, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 135 days.

(21) Appl. No.: 12/893,664

(22) Filed: Sep. 29, 2010

(65) Prior Publication Data
US 2011/0121315 A1 May 26, 2011

Related U.S. Application Data

(63) Continuation of application No. PCT/JP2008/056425, filed on Mar. 31, 2008.

(51) Int. Cl.
*H01L 29/06* (2006.01)
*H01L 31/00* (2006.01)

(52) U.S. Cl. ............ 257/19; 257/18; 257/E21.182; 257/E21.562; 257/E21.571; 257/E29.193; 438/300; 438/303; 438/200

(58) Field of Classification Search .......... 257/18, 257/19, E21.182, E21.562, E21.571, E29.193, 257/616; 438/197, 200, 222, 226, 269, 231, 438/300, 303
See application file for complete search history.

(56) References Cited

U.S. PATENT DOCUMENTS

| 7,510,925 | B2 | 3/2009 | Miyanami |
| 7,579,617 | B2 | 8/2009 | Shimamune et al. |
| 7,683,362 | B2 | 3/2010 | Ohta et al. |
| 2006/0289856 | A1 | 12/2006 | Shimamune et al. |
| 2007/0012913 | A1 | 1/2007 | Ohta et al. |
| 2007/0196989 | A1 | 8/2007 | Kim et al. |
| 2007/0254414 | A1 | 11/2007 | Miyanami |
| 2008/0054364 | A1 | 3/2008 | Hokazono |
| 2009/0215240 | A1 | 8/2009 | Kim et al. |
| 2009/0280612 | A1 | 11/2009 | Shimamune et al. |
| 2010/0129971 | A1 | 5/2010 | Ohta et al. |

FOREIGN PATENT DOCUMENTS

| JP | 2006-261283 A | 9/2006 |
| JP | 2007-036205 A | 2/2007 |
| JP | 2007-227565 A | 9/2007 |
| JP | 2007-294707 A | 11/2007 |
| JP | 2008-060408 A | 3/2008 |

OTHER PUBLICATIONS

Mistry, K. et al "Delaying Forever: Uniaxial Strained Silicon Transistors in a 90nm CMOS Technology," 2004 Symposium on VLSI Technology, Digest of Technical Papers, 2004, pp. 50-51.
International Search Report of PCT/JP2008/056425, mailing date Jul. 1, 2008.
Translation of International Preliminary Examination Report on Patentability, mailed Dec. 23, 2010, issued in International Application No. PCT/JP/2008/056425.

*Primary Examiner* — Telly Green
(74) *Attorney, Agent, or Firm* — Westerman, Hattori, Daniels & Adrian, LLP

(57) ABSTRACT

A recess along a sidewall is formed in a pMOS region and an nMOS region. An SiC layer of which thickness is thicker than a depth of the recess is formed in the recess. A sidewall covering a part of the SiC layer is formed at both lateral sides of a gate electrode in the pMOS region. A recess is formed by selectively removing the SiC layer in the pMOS region. A side surface of the recess at the gate insulating film side is inclined so that the upper region of the side surface, the closer to the gate insulating film in a lateral direction at a region lower than the surface of the silicon substrate. An SiGe layer is formed in the recess in the pMOS region.

19 Claims, 12 Drawing Sheets

SEMICONDUCTOR DEVICE AND MANUFACTURING METHOD THEREOF

CROSS-REFERENCE TO RELATED APPLICATIONS

This application is a Continuation of International Application No. PCT/JP2008/056425, with an international filing date of Mar. 31, 2008, which designating the United States of America, the enter contents of which are incorporated herein by reference.

FIELD

The present embodiment relates to a semiconductor device and a manufacturing method thereof.

BACKGROUND

Recently, many attempts have been made in which mobility of carriers (electrons and holes) moving at a channel region is improved by generating a strain in a channel to thereby improve an operation speed of a semiconductor device.

In general, the mobility of the hole is smaller than that of the electron in a transistor in which a region where impurity is doped into a silicon substrate is a channel. Accordingly, it is important in a design of a semiconductor integrated circuit device to improve the operation speed of a p-channel MOS transistor, of which carrier is the hole. It is known that the mobility of the hole improves by generating a uniaxial compressive strain at the channel region in the p-channel MOS transistor. Besides, it is principally pointed that the larger the compressive strain generated at the channel region is, the more the mobility of the hole increases, in the p-channel MOS transistor as stated above (Non-Patent Document 1).

In a formation of the p-channel MOS transistor, a method has been studied in which recesses are formed at a source region and a drain region of the silicon substrate, and SiGe layers containing boron (B) are epitaxially grown thereon.

It is preferable that an end portion of the SiGe layer is approximated to the channel region so as to enlarge the compressive strain generated at the channel region, in the method as stated above. However, a problem resulting from a short channel effect occurs in the conventional method only by approximating the SiGe layer to the channel region because the SiGe layer contains B being a p-type impurity.

Patent Document 1: Japanese Laid-open Patent Publication No. 2007-36205

Non-Patent Document 1: K. Mistry, et al., 2004 Symposium on VLSI Technology, Digest of Technical Papers, pp. 50-51

SUMMARY

According to an aspect of a manufacturing method of a semiconductor device, an n-well is formed at a surface of a silicon substrate, a gate insulating film is formed on the silicon substrate, and a gate electrode is formed on the gate insulating film. A first sidewall is formed at both lateral sides of the gate electrode. A first recess is formed along the first sidewall at a surface of the silicon substrate. An SiC layer of which thickness is thicker than a depth of the first recess is formed in the first recess. A second sidewall covering a part of the SiC layer is formed at both lateral sides of the gate electrode. The SiC layer is selectively removed so as to form a second recess. A side surface of the second recess at the gate insulating film side is inclined so that the upper region of the side surface, the closer to the gate insulating film in a lateral direction at a region lower than the surface of the silicon substrate. An SiGe layer is formed in the second recess.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

Figure 1A:
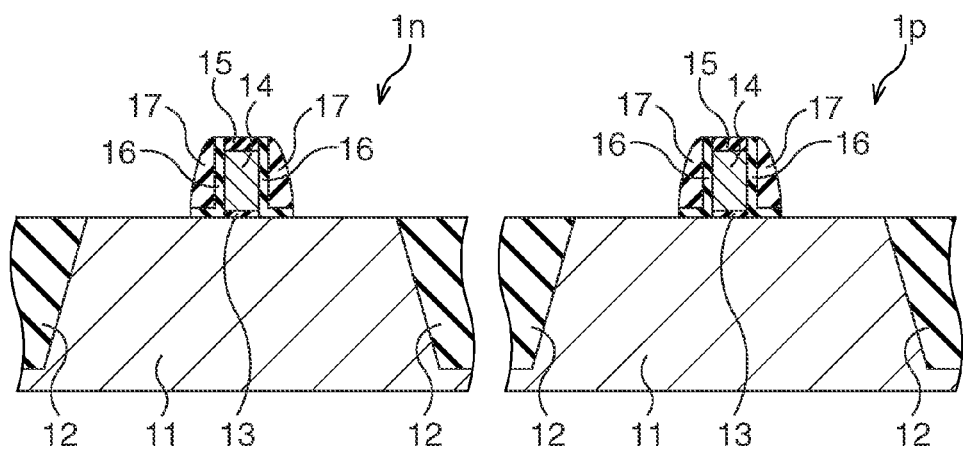
FIG. 1A to FIG. 1U are sectional views illustrating a manufacturing method of a semiconductor device according to a embodiment in process sequence.

Hereinafter, embodiments are concretely described with reference to the attached drawings. Note that a structure of a semiconductor device is described together with a manufacturing method thereof for convenience. FIG. 1A to FIG. 1U are sectional views illustrating the manufacturing method of the semiconductor device according to the embodiment in process sequence.

First, an element isolation insulating film 12 defining an nMOS region 1n (second active region) and a pMOS region 1p (first active region) is formed at a surface of a silicon substrate 11 of which Miller index is (001), for example, by an STI (Shallow Trench Isolation) method, as illustrated in FIG. 1A. The nMOS region 1n is a region where an re-channel MOS transistor is to be formed, and the pMOS region 1p is a region where a p-channel MOS transistor is to be formed. A p-well (not-illustrated) is formed at the surface of the silicon substrate 11 in the nMOS region 1n, and an n-well (not-illustrated) is formed at the surface of the silicon substrate 11 in the pMOS region 1p, after the element isolation insulating film 12 is formed.

Next, an insulating film of which thickness is, for example, approximately 1.2 nm is formed. For example, a thermal oxide film or an SiON film is formed as the insulating film. After that, a polycrystalline silicon film is formed on the insulating film. Subsequently, a silicon nitride film is formed on the polycrystalline silicon film. A cap film 15, a gate electrode 14 and a gate insulating film 13 are formed by performing patterning of the silicon nitride film, the polycrystalline silicon film and the insulating film. For example, the Miller index in a channel direction of the gate electrode 14 is [110].

Next, a silicon oxide film is formed on a whole surface by a CVD method, further a silicon nitride film is formed, and an etch-back is performed to thereby form a CVD oxide film 16 and a sidewall insulating film 17. The CVD oxide film 16 covers a part of the surface of the silicon substrate 11 and a side surface of the gate electrode 14. A total thickness of the CVD oxide film 16 and the sidewall insulating film 17 in a lateral direction is set to be approximately 15 nm.

Figure 1B:
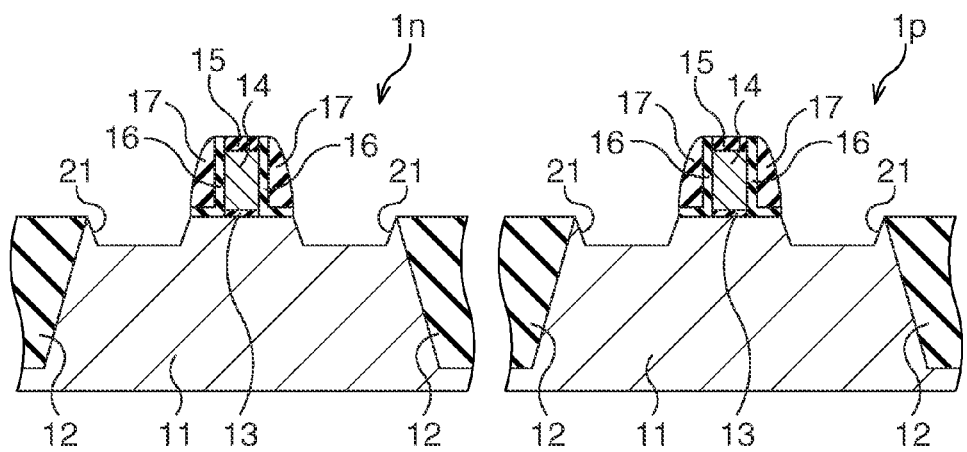

After that, recesses 21 are formed at the surface of the silicon substrate 11 in the nMOS region 1n and the pMOS region 1p by performing an isotropic chemical dry etching, as illustrated in FIG. 1B. A depth of the recess 21 is set to be approximately 50 nm, for example.

Figure 1C:
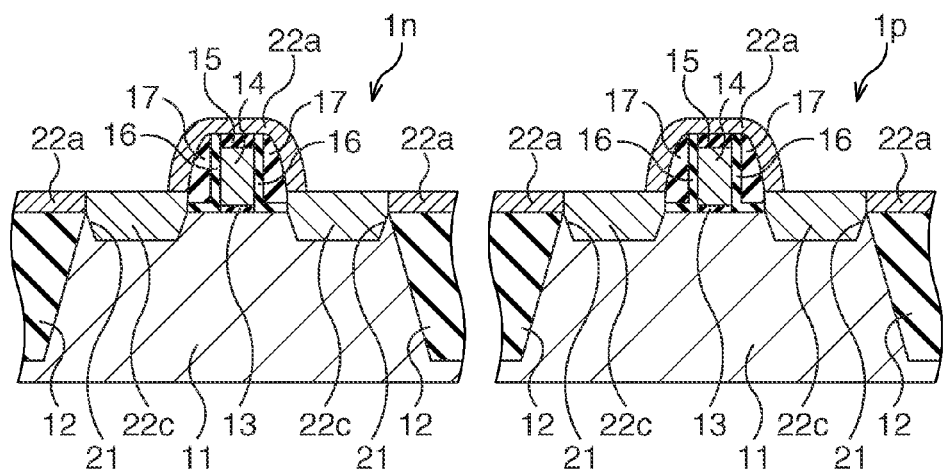

Subsequently, selectively, a crystalline SiC layer 22c is formed in the recess 21, and an SiC layer 22a in an amorphous state is formed on the insulating film such as the element isolation insulating film 12, as illustrated in FIG. 1C. Note that a thickness of the SiC layer 22c is set to be approximately 60 nm to 70 nm, for example, and it is protruded from the surface of the silicon substrate 11 for approximately 10 nm to 20 nm. Incidentally, C concentration in the SiC layers 22a and 22c is approximately 2 atom %. Besides, it is preferable that an n-type impurity such as arsenic or phosphorus is contained in the SiC layers 22a and 22c.

Figure 1D:
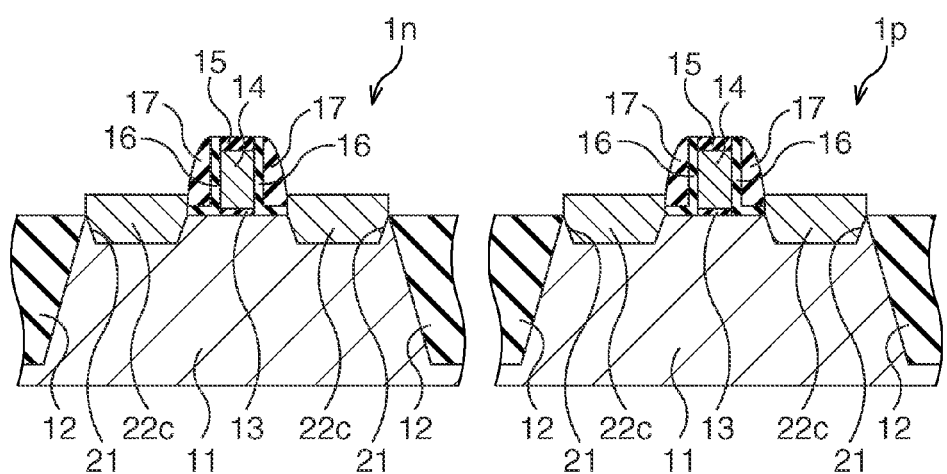

Next, the SiC layer 22a in an amorphous state is removed by etching using hydrogen chloride gas or the like, as illustrated in FIG. 1D.

Figure 1E:
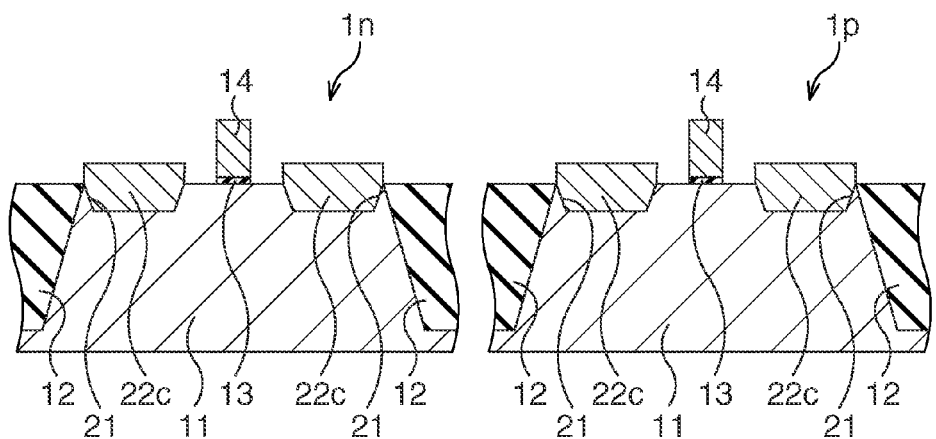

After that, the sidewall insulating film 17 is removed by etching using phosphoric acid, and the CVD oxide film 16 is removed by etching using hydrofluoric acid, as illustrated in FIG. 1E.

Figure 1F:
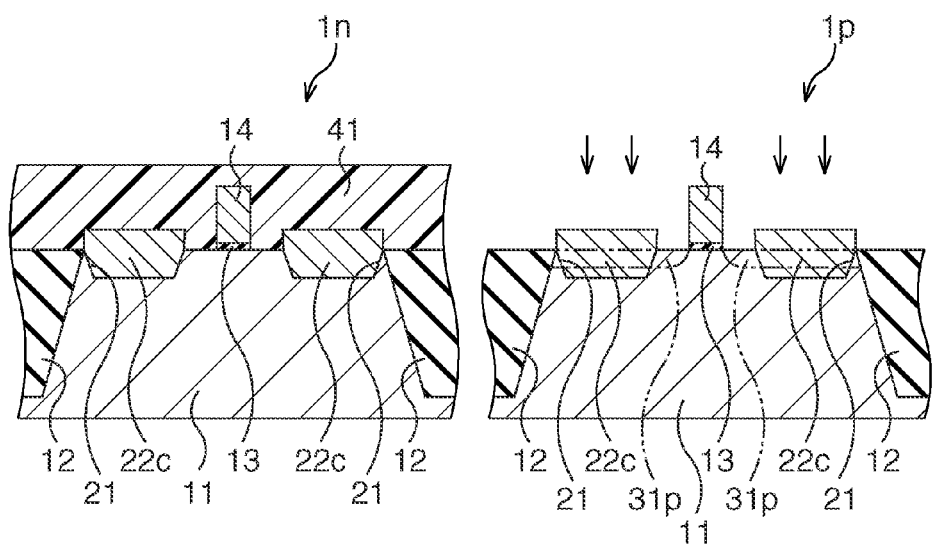

Subsequently, a resist pattern 41 covering the nMOS region 1n is formed, as illustrated in FIG. 1F. Next, a p-type impurity, for example, B-ion is doped into the surface of the silicon substrate 11 with an energy of approximately 0.5 keV while using the resist pattern 41 and the gate electrode 14 in the pMOS region 1p as a mask. Further, doping of a small amount of n-type impurity, for example, arsenic (As) or antimony (Sb) is also performed. Impurity doping regions 31p are formed as a result of the above-stated doping. The impurity doping regions 31p include so-called a p-type extension region and an n-type pocket region.

Figure 1G:
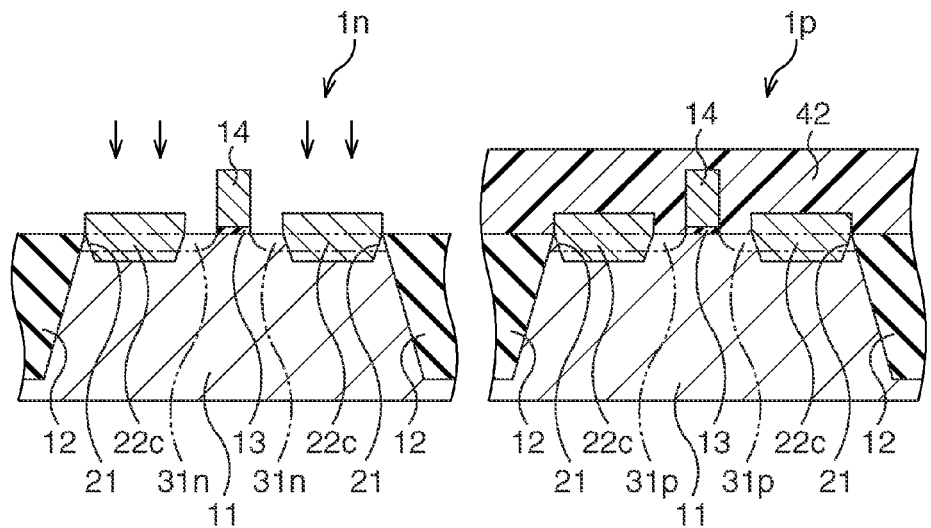

After that, the resist pattern 41 is removed, and a resist pattern 42 covering the pMOS region 1p is formed, as illustrated in FIG. 1G. Subsequently, an n-type impurity, for example, As-ion is doped into the surface of the silicon substrate 11 with an energy of approximately 3 keV while using the resist pattern 42 and the gate electrode 14 in the nMOS region 1n as a mask. Further, doping of a small amount of p-type impurity, for example, B or indium (In) is also performed. Impurity doping regions 31n are formed as a result of the above-stated doping. The impurity doping regions 31n include so-called an n-type extension region and a p-type pocket region.

Figure 1H:
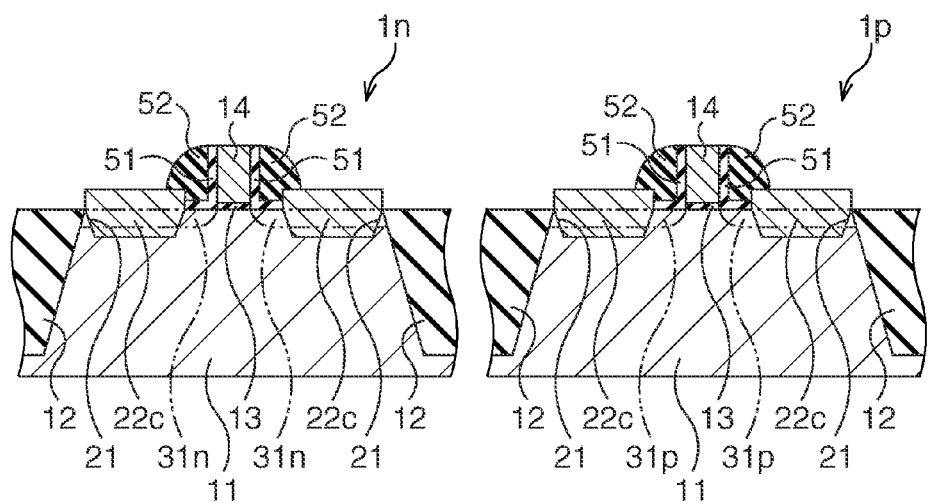

Next, the resist pattern 42 is removed, as illustrated in FIG. 1H. After that, a silicon oxide film is formed by a CVD method, further a silicon nitride film is formed, and an etchback is performed for these to thereby form a CVD oxide film 51 and a sidewall insulating film 52. The CVD oxide film 51 covers a part of the surface of the silicon substrate 11 and the side surface of the gate electrode 14. A total thickness of the CVD oxide film 51 and the sidewall insulating film 52 in a lateral direction is thicker than the total thickness of the CVD oxide film 16 and the sidewall insulating film 17, and it is approximately 30 nm, for example.

Figure 1I:
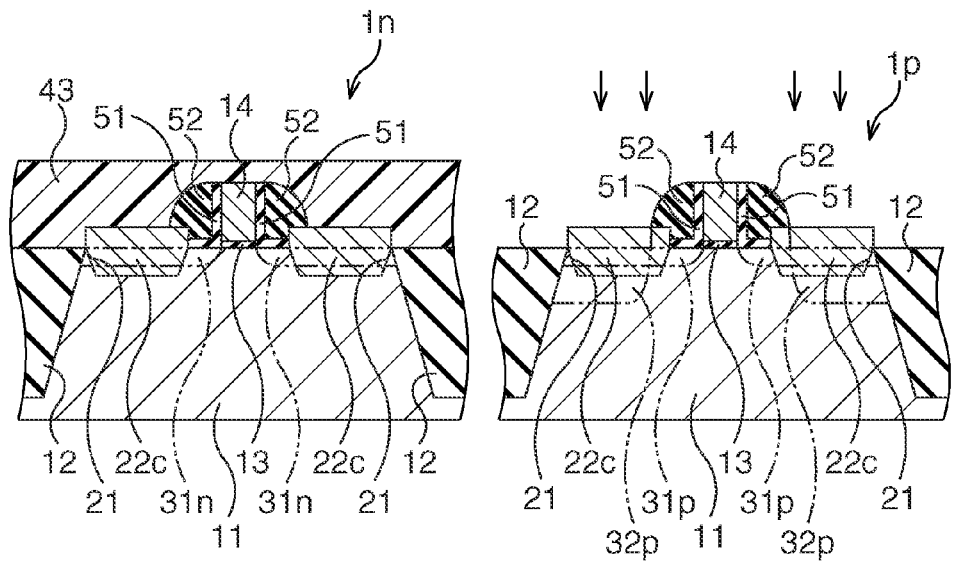

Subsequently, a resist pattern 43 covering the nMOS region 1n is formed, as illustrated in FIG. 1I. Next, a p-type impurity, for example, B-ion is doped into the surface of the silicon substrate 11 with an energy of approximately 2 keV while using the gate electrode 14, the sidewall insulating film 52 and so on in the pMOS region 1p, and the resist pattern 43, as a mask. Impurity doping regions 32p deeper than the impurity doping regions 31p are formed as a result of the above-stated doping.

Figure 1J:
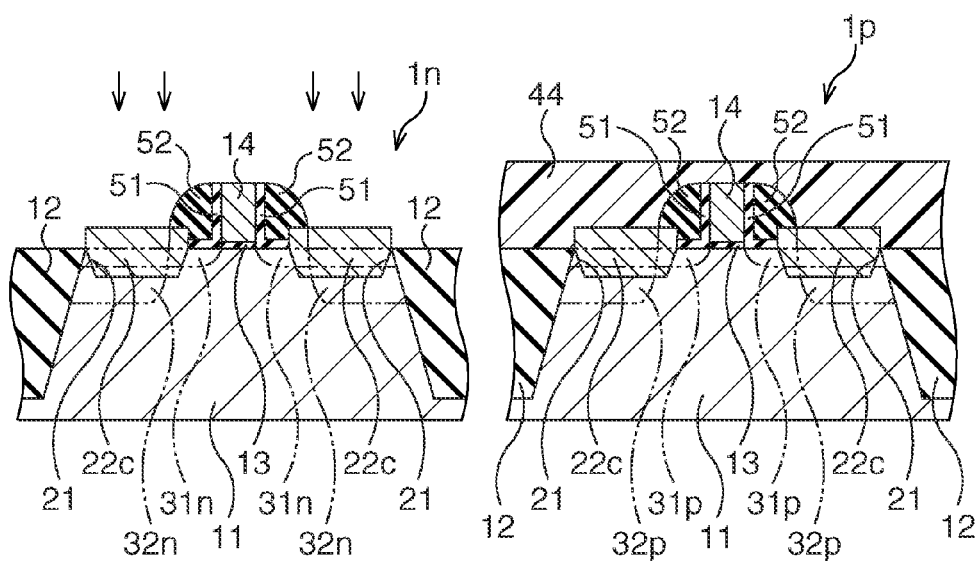

After that, the resist pattern 43 is removed, and a resist pattern 44 covering the pMOS region 1p is formed, as illustrated in FIG. 1J. Subsequently, an n-type impurity, for example, As-ion or phosphorus (P)-ion is doped into the surface of the silicon substrate 11 with an energy of approximately 6 keV while using the gate electrode 14, the sidewall insulating film 52 and so on in the nMOS region 1n, and the resist pattern 44, as a mask. Impurity doping regions 32n deeper than the impurity doping regions 31n are formed as a result of the above-stated doping.

Figure 1K:
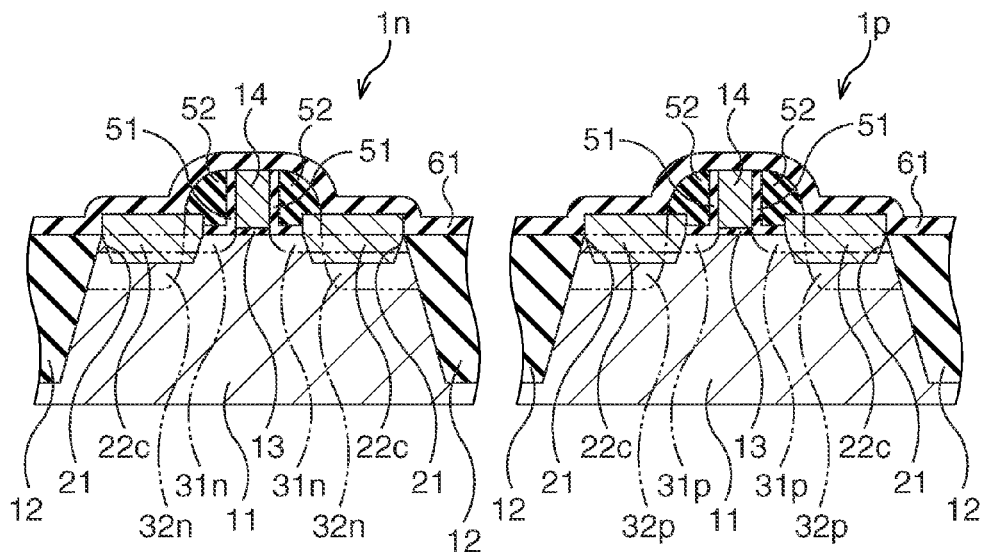

Next, the resist pattern 44 is removed, as illustrated in FIG. 1K. After that, a silicon oxide film 61 of which thickness is approximately 50 nm is formed on the whole surface by, for example, a plasma CVD method.

Figure 1L:
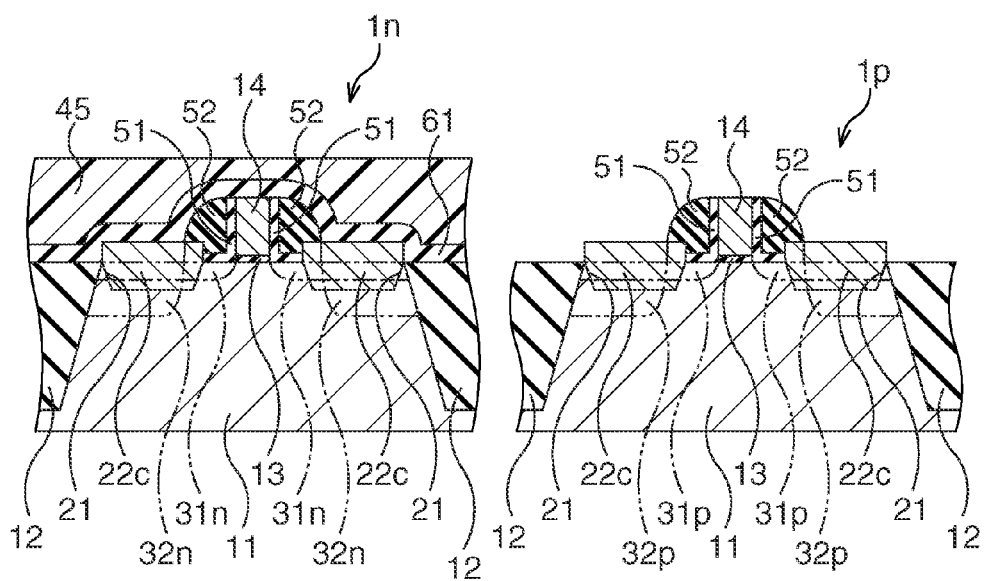

Subsequently, a resist pattern 45 covering the nMOS region 1n is formed, as illustrated in FIG. 1L. Next, the silicon oxide film 61 in the pMOS region 1p is removed by dry etching.

Figure 1M:
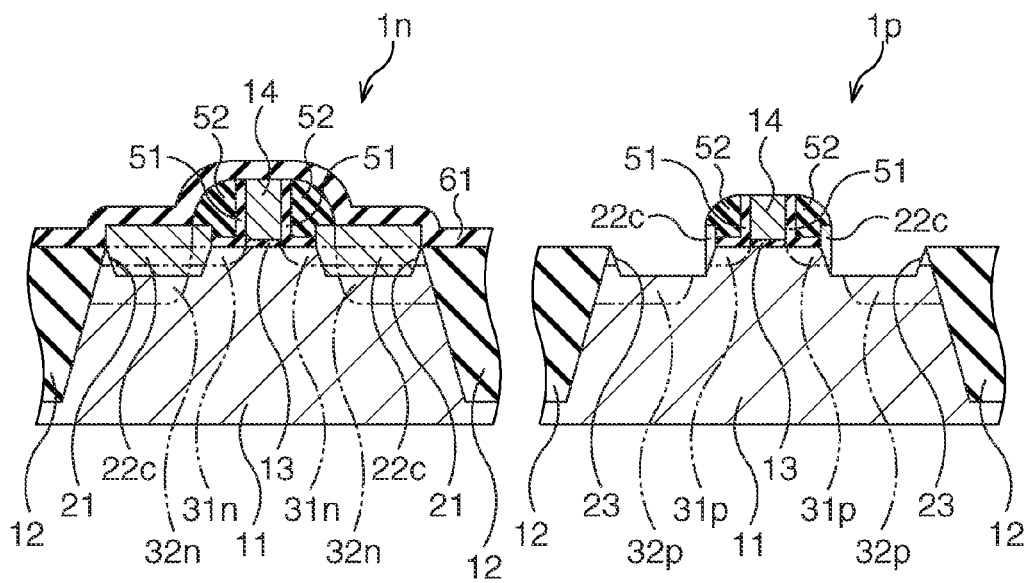

After that, the resist pattern 45 is removed, as illustrated in FIG. 1M. Subsequently, a portion of the SiC layer 22c, the portion exposing from the sidewall insulating film 52 is removed in the pMOS region 1p by performing reactive ion etching (RIE). Recesses 23 are formed as a result of the above. Besides, the gate electrode 14, the CVD oxide film 51 and the sidewall insulating film 52 are slightly lowered in the pMOS region 1P.

Figure 1N:
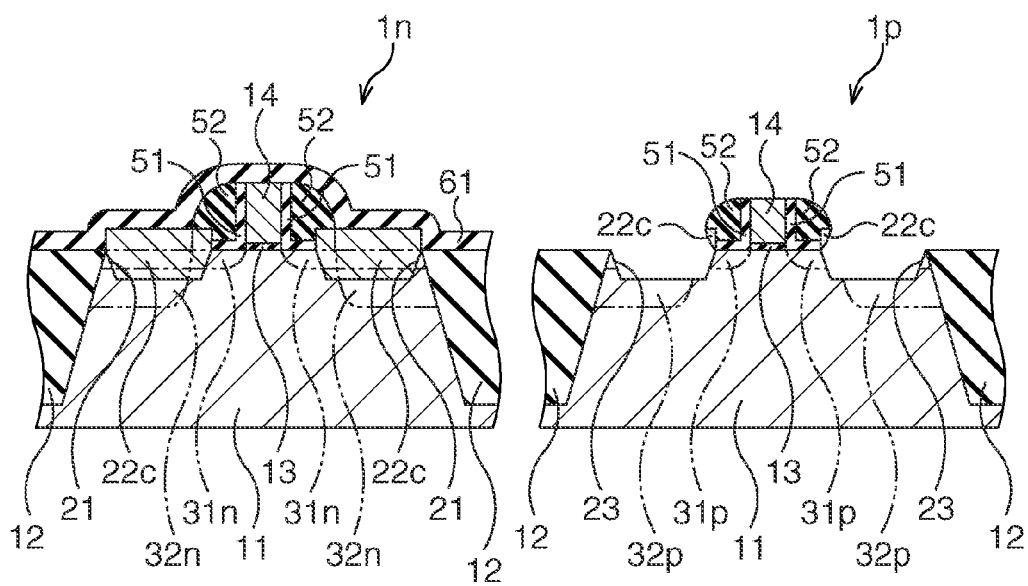

Next, wet etching using tetramethylammonium hydroxide (TMAH) solution is performed. For example, a solution of which concentration of TMAH is approximately 5 mass % to 40 mass %, and of which temperature is approximately 30° C. to 50° C. is used as the TMAH solution. A processing time is set to be approximately for 10 seconds to 30 minutes. In the process as stated above, an etching speed decreases drastically if a surface of which Miller index is {111} appears at a side surface of the recess 23. As a result, a portion of the SiC layer is selectively removed, the portion being under the sidewall insulating film 52, and the side surface of the recess 23 cuts into the channel region, as illustrated in FIG. 1N. At this time, a region cutting into the channel region the most is in a vicinity of an interface between the silicon substrate 11 and the remaining SiC layer 22c. In other words, the side surface of the recess 23 at the gate insulating film 13 side is inclined so that the upper region of the side surface, the closer to the gate insulating film 13 in a lateral direction at a region lower than the surface of the silicon substrate 11. Note that an etching amount at the time of the wet etching is approximately 10 nm to 20 nm, for example.

Figure 1O:
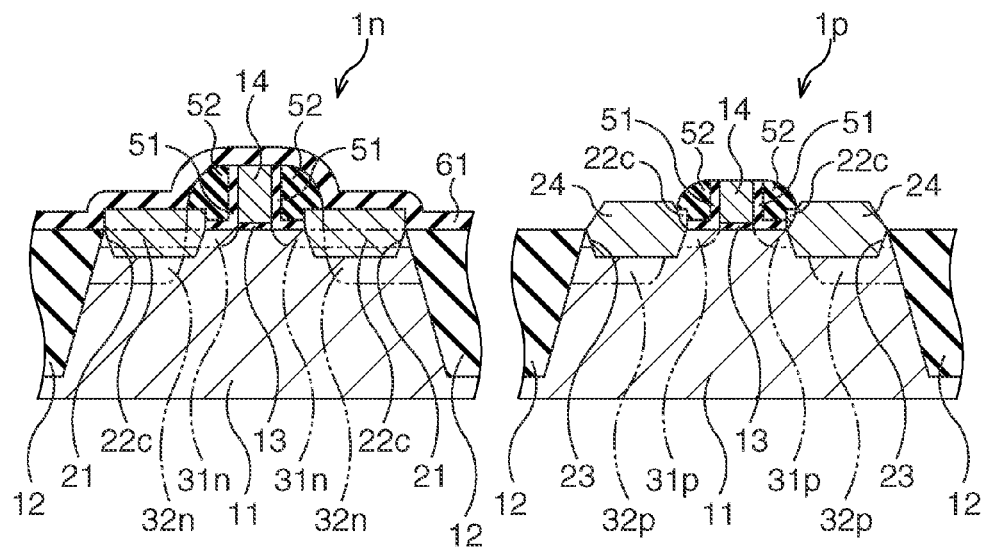

After that, an SiGe layer 24 containing B is formed in the recess 23 by a CVD method using mixed gas of $SiH_4$, HCl, $GeH_4$ and $B_2H_6$, as illustrated in FIG. 1O. At this time, the SiGe layer 24 is protruded upward from the recess 23. The SiGe layer 24 is formed by epitaxial growth. The $SiH_4$ is source gas of Si, and the $GeH_4$ is source gas of Ge. Besides, the HCl is gas improving selectivity in growth direction, and the $B_2H_6$ is source gas of B. Incidentally, Ge fraction in the SiGe layer 24 is set to be approximately 20 atom %, for example, but it may be changed in a thickness direction. In particular, it is possible to generate the larger compressive strain at the channel region if the Ge fraction is made high at the region where the recess 23 cuts into the channel region side the most.

Note that it is preferable to perform preprocessing as stated below before the formation of the SiGe layer 24. First, a native oxide film existing on the surface of the silicon substrate 11 is removed. Subsequently, a substrate temperature is raised up to 400° C. to 600° C. in a hydrogen atmosphere. A hydrogen bake-out is performed by holding under a condition at a pressure of 5 Pa to 1330 Pa, a temperature of 400° C. to 600° C. for approximately 60 minutes at most.

Figure 1P:
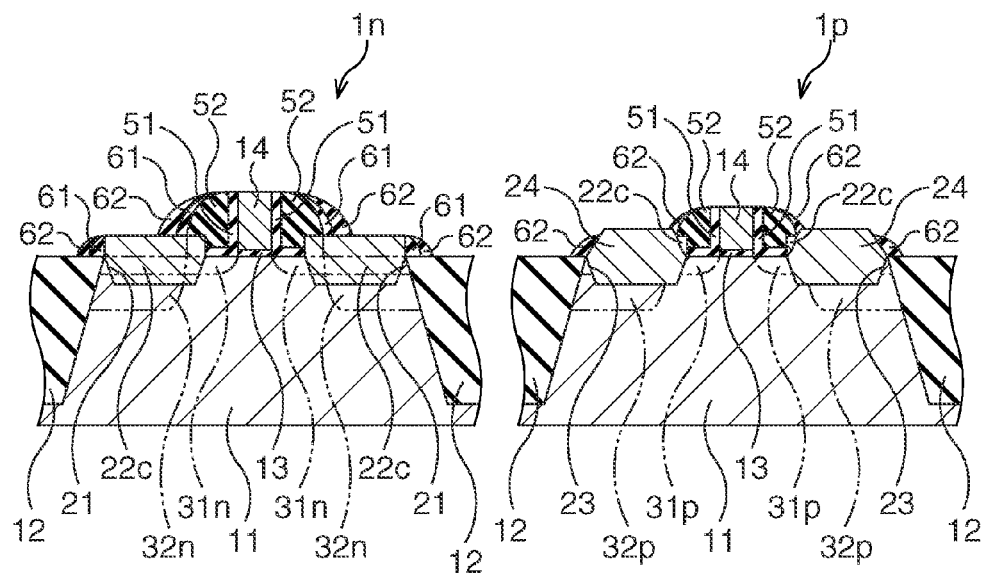

After the formation of the SiGe layer 24, a silicon oxide film is formed on the whole surface by a thermal CVD method using, for example, a low pressure CVD apparatus and it is etched back. As a result, a part of the silicon oxide film 61 remains and a sidewall insulating film 62 is formed at a lateral side thereof, in the nMOS region 1n, as illustrated in FIG. 1P. Besides, the sidewall insulating film 62 is formed so as to embed a concave existing in a vicinity of an interface between the sidewall insulating film 52 and the SiGe layer 24, in the pMOS region 1p.

Figure 1Q:
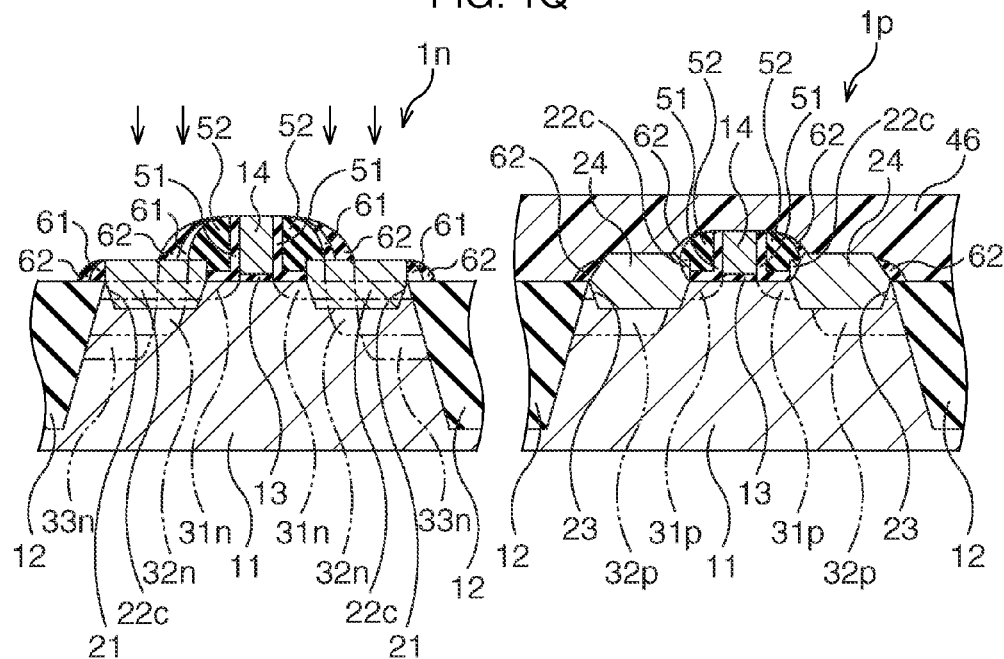

Next, a resist pattern 46 covering the pMOS region 1p is formed, as illustrated in FIG. 1Q. After that, an n-type impurity, for example, P-ion is doped into the surface of the silicon substrate 11 with an energy of approximately 8 keV while using the gate electrode 14, the sidewall insulating film 62 and so on in the nMOS region 1n, and the resist pattern 46, as a mask. Impurity doping regions 33n deeper than the impurity doping regions 32n are formed as a result of the above-stated doping.

Figure 1R:
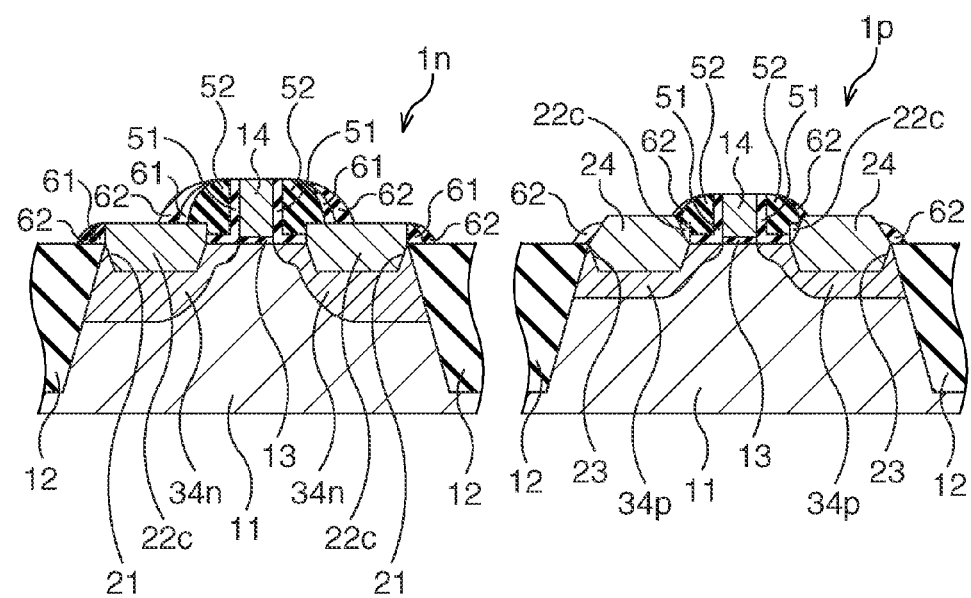

Subsequently, the resist pattern 46 is removed, as illustrated in FIG. 1R. Next, the impurities in the impurity doping regions 31n, 32n, 33n, 31p and 32p are activated and defused by annealing (temperature: 1000° C. to 1100° C., nitride atmosphere, time: "0" (zero) second to 3 seconds (Note that the annealing for "0" (zero) second means a spike annealing.)). As a result, impurity diffusion layers 34n at least partially overlapping with the SiC layers 22c are formed in the nMOS region 1n, and impurity diffusion layers 34p at least partially overlapping with the SiGe layers 24 are formed in the pMOS region 1p.

Figure 1S:
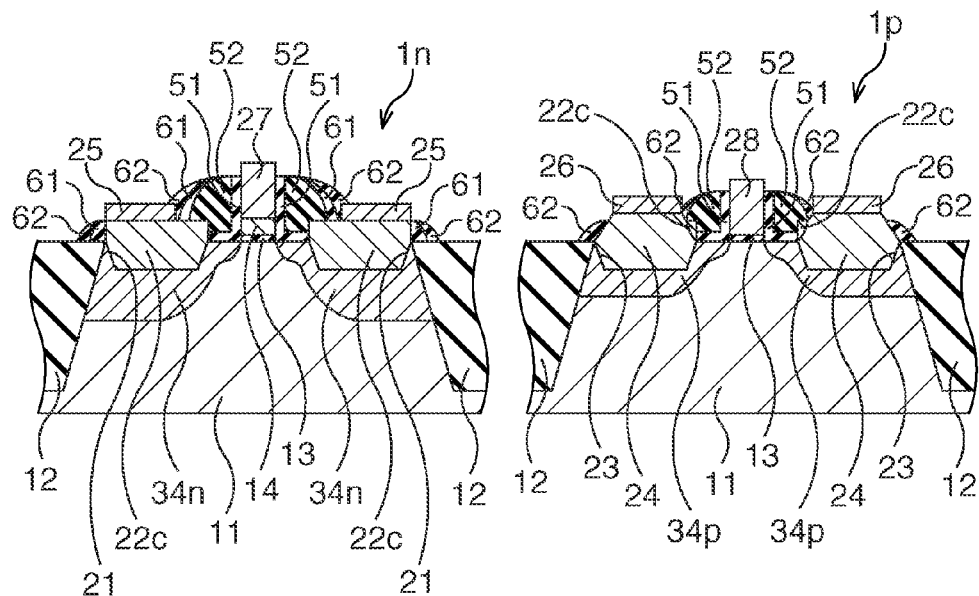

After that, an Ni or Ni alloy film of which thickness is approximately 10 nm is formed on the whole surface, and RTA (Rapid Thermal Annealing) at approximately 300° C. is performed. As a result, silicide layers 25 are formed at the surfaces of the SiC layers 22c and a silicide layer 27 is formed at the surface of the gate electrode 14 in the nMOS region 1n, as illustrated in FIG. 1S. Besides, silicide layers 26 are formed at the surfaces of the SiGe layers 24 and a silicide layer 28 is formed at the surface of the gate electrode 14 in the pMOS region 1p. Incidentally, the gate electrode 14 in the pMOS region 1p is lower than the gate electrode 14 in the nMOS region 1n, and therefore, all of the gate electrode 14 in the pMOS region 1p may be made to be the silicide layer 28. Unreacted portions of the Ni or Ni alloy film are removed after the formation of the silicide layers 25 to 28.

Figure 1T:
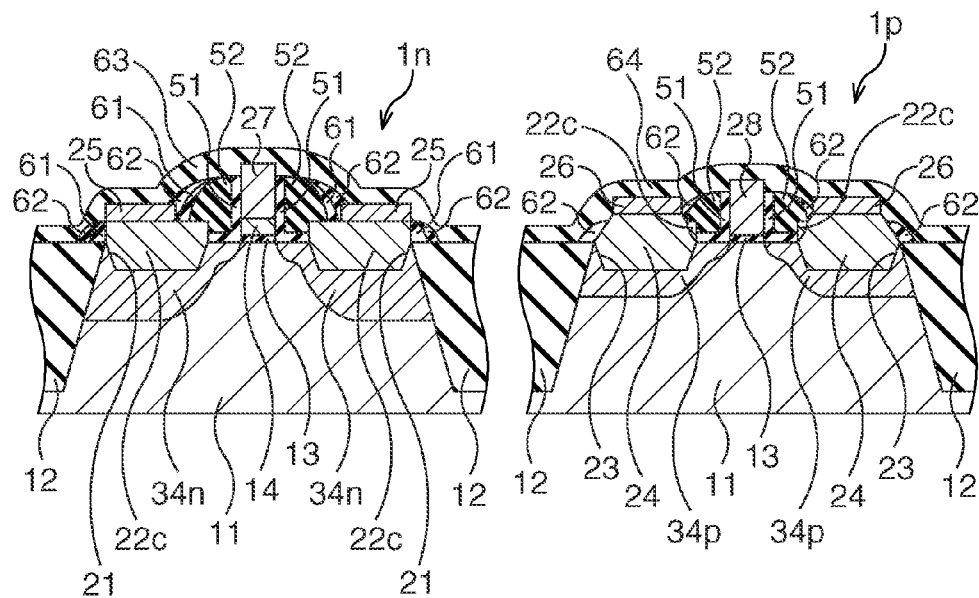
Figure 1U:
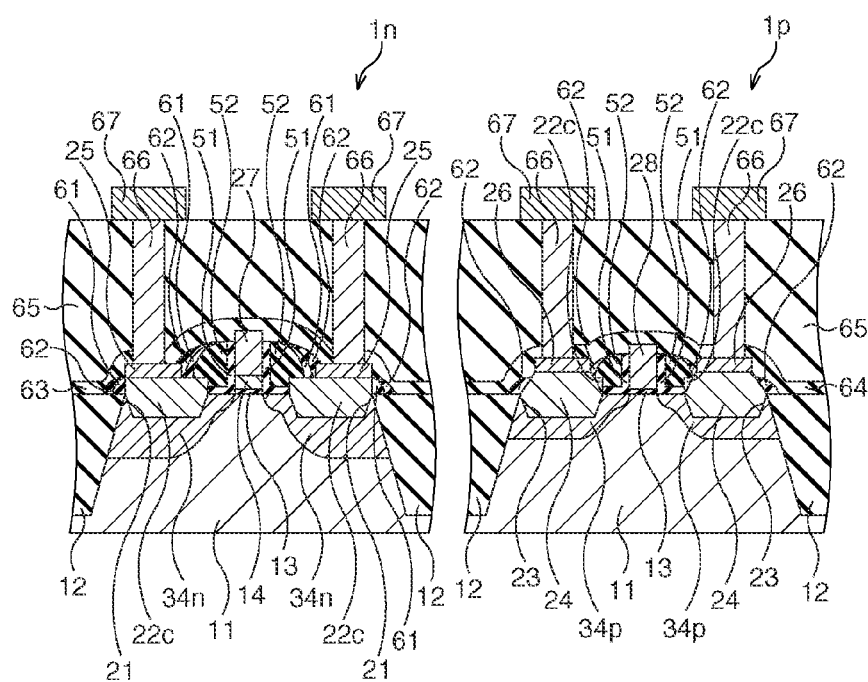

Subsequently, an insulating film 63 affecting a tensile stress on the channel region is formed in the nMOS region 1n, and an insulting film 64 affecting a compressive stress on the channel region is formed in the pMOS region 1p, as illustrated in FIG. 1T. Silicon nitride films of which compositions are different from one another may be used as the insulating films 63, 64. It is difficult to simultaneously form the insulating films 63 and 64, and therefore, they are formed by processes different from one another.

Next, an interlayer insulating film 65 is formed on the whole surface, and contact holes reaching the silicide layers 25, 27 are formed in the interlayer insulating film 65, as illustrated in FIG. 1U. Contact holes reaching the silicide layers 26, 28 are also formed, though they are not illustrated. After that, contact plugs 66 are formed in the contact holes, and wirings 67 which bring into contact with the contact plugs 66 are formed on the interlayer insulating film 65. After that, interlayer insulating films, wirings, and so on at further upper layers are further formed to complete a semiconductor device.

Figure 2A:
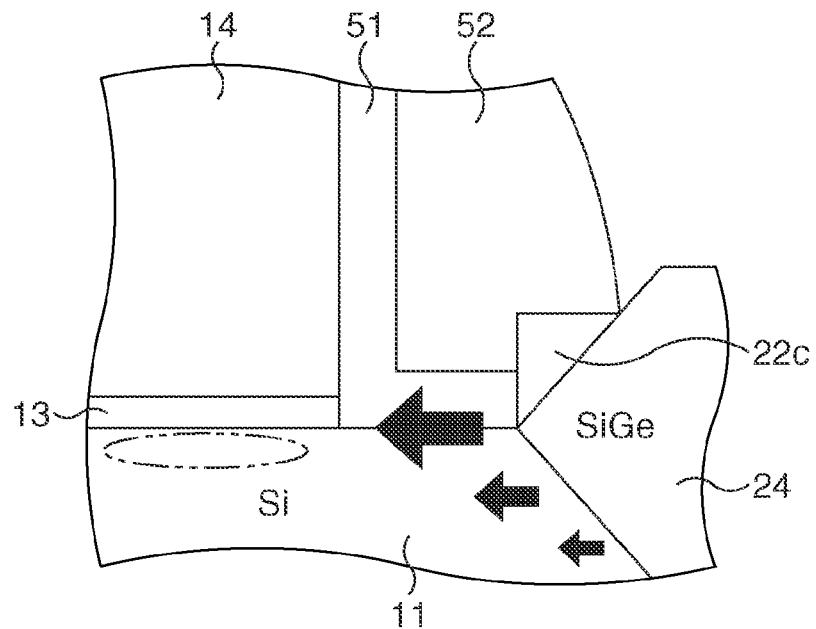
FIG. 2A is a schematic view illustrating a stress distribution obtained by the embodiment.

According to the embodiment as stated above, a height of a portion of the recess 23 cutting into the channel region side the most becomes approximately an equivalent height of an interface between the silicon substrate 11 and the gate insulating film 13, as illustrated in FIG. 2A. This means that a height where a stress from the SiGe layer 24 affects the most approximately matches with a height of a region where the mobility of the hole affects the operation speed the most (a region surrounded by a two-dot chain line in FIG. 2A). Accordingly, it is possible to improve the mobility of the hole further more and to improve the operation speed further more.

Figure 2B:
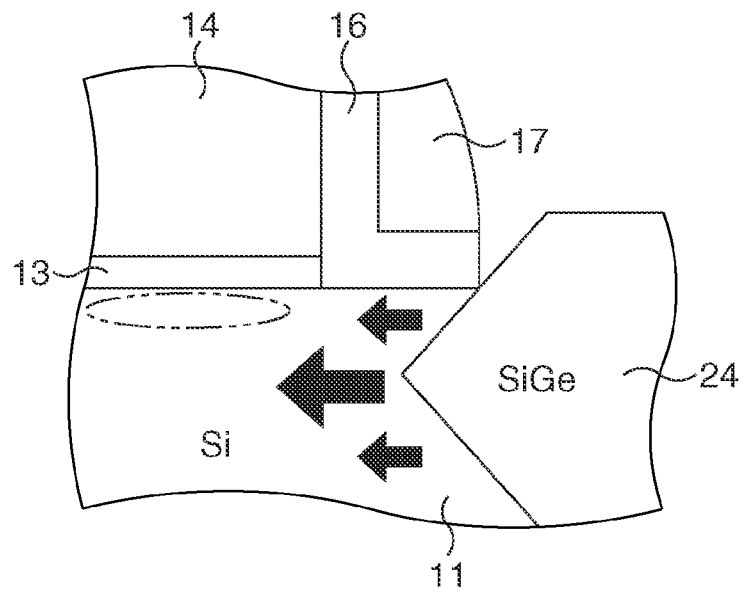
FIG. 2B is a schematic view illustrating the stress distribution obtained when a wet etching using a TMAH is performed only for a recess 21.

It is also conceivable to perform wet etching using a TMAH for the recess 21 (FIG. 1B). However, as illustrated in FIG. 2B, a height of a portion of the recess 21 cutting into the channel side the most positions deeper in this case compared to the case illustrated in FIG. 2A. This is because the SiC layer 22c is not formed on the silicon substrate 11 in advance and the etching proceeds in a deeper direction. The region where the stress affects the most becomes a deeper region compared to the case illustrated in FIG. 2A. Besides, a strain applied to the channel becomes weaker even if distances between the SiGe layers are the same when the SiGe layer is just formed in the recess 21. This is described in IEDM 2005, High Performance 30 nm Gate Bulk CMOS for 45 nm Node with Σ-shaped SiGe-SD.

Besides, in the present embodiment, the SiC layers 22c are embedded in the recesses 21 in the nMOS region 1n. The SiC layers 22c generate a tensile strain at the channel region of the n-channel MOS transistor in the nMOS region 1n, and therefore, the mobility of the electron at the transistor improves. The SiC layers 22c formed in the pMOS region 1p are simultaneously formed with the SiC layers 22c in the nMOS region 1n. Namely, a process to form the SiC layers 22c just to control the shapes of the recesses 23 is not necessary. This means that increase in the number of processes is suppressed because the process to form an SiC layer for an re-channel MOS transistor which has been performed conventionally can be used as it is.

The transistor in which the strain is generated at the channel can be used for, for example, a logic circuit portion of an SoC (System on Chip). Besides, it can be used for an equipment such as a cellular phone, in which a high-speed communication is performed.

Note that the Si layers may be remained instead of the SiC layers 22c in the pMOS region 1p, but in this case, another process may become necessary in addition to the SiC layers 22c in the nMOS region 1n. Besides, according to a simulation performed by the present inventors, a result is obtained in which a larger strain can be generated at the channel when the SiC layers 22c are used. Accordingly, it is preferable to use the SiC layers 22c also in the pMOS region 1p.

Besides, it is not necessary to remove the sidewall 17 before the formation of the sidewall 52 depending on the timing to form the impurity doping region 31p, and the sidewall 52 may be formed while making the sidewall 17 thick.

According to the semiconductor device and the manufacturing method thereof, it is possible to generate the large compressive strain from the SiGe layer to the channel in the p-channel MOS transistor, and to further improve the mobility of the hole. Besides, it is possible to generate the large tensile strain to the channel and to further improve the mobility of the electron when the SiC layer is used in the n-channel MOS transistor. Besides, it is also possible to simultaneously form the SiC layer in the p-channel MOS transistor with the SiC layer in the re-channel MOS transistor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A manufacturing method of a semiconductor device, comprising:
    forming an n-well in a silicon substrate;
    forming a gate insulating film on the silicon substrate;
    forming a gate electrode on the gate insulating film;
    forming a first sidewall insulating film at both lateral sides of the gate electrode;
    forming a first recess in the silicon substrate using the first sidewall insulating film;
    forming an SiC layer of which thickness is thicker than a depth of the first recess in the first recess;
    forming a second sidewall insulating film covering a part of the SiC layer at both lateral sides of the gate electrode;
    selectively removing the SiC layer so as to form a second recess, a side surface of the second recess at the gate insulating film side being inclined; and
    forming an SiGe layer in the second recess.

2. The manufacturing method of a semiconductor device according to claim 1, wherein the forming a second recess comprises:
    removing a first portion of the SiC layer, the first portion exposing from the second sidewall; and
    selectively removing a second portion of the SiC layer, the second portion being under the second sidewall insulating film.

3. The manufacturing method of a semiconductor device according to claim 2, wherein wet etching using tetramethylammonium hydroxide is performed at the selectively removing a second portion.

4. The manufacturing method of a semiconductor device according to claim 1, wherein the SiC layer is epitaxially grown in the forming an SiC layer.

5. The manufacturing method of a semiconductor device according to claim 1, wherein the SiGe layer is epitaxially grown in the forming an SiGe layer.

6. The manufacturing method of a semiconductor device according to claim 1, wherein Miller index of the side surface of the second recess at the gate insulating film side is {111}.

7. The manufacturing method of a semiconductor device according to claim 1, further comprising forming a p-type impurity diffusion layer at least partially overlapping with the SiGe layer.

8. The manufacturing method of a semiconductor device according to claim 1, further comprising removing the first sidewall insulating film between the forming an SiC layer and the forming a second sidewall insulating film,
    wherein the second sidewall insulating film is thicker than the first sidewall insulating film in a lateral direction.

9. A manufacturing method of a semiconductor device, comprising:
    defining a first active region and a second active region in a silicon substrate, forming an n-well in the first active region, and forming a p-well in the second active region;
    forming a gate insulating film on the silicon substrate in the first active region and the second active region;
    forming a gate electrode on the gate insulating film in the first active region and the second active region;
    forming a first sidewall unsulating film at both lateral sides of the gate electrode in the first active region and the second active region;
    forming a first recess along the first sidewall insulating film in the silicon substrate in the first active region and the second active region;
    forming an SiC layer of which thickness is thicker than a depth of the first recess in the first recess in the first active region and the second active region;
    forming a second sidewall insulating film covering a part of the SiC layer at both lateral sides of the gate electrode in the first active region;
    selectively removing the SiC layer so as to form a second recess, a side surface of the second recess at the gate insulating film side being inclined; and
    forming an SiGe layer in the second recess in the first active region.

10. The manufacturing method of a semiconductor device according to claim 9, wherein the forming a second recess comprises:
    removing a first portion of the SiC layer, the first portion exposing from the second sidewall insulating film; and
    selectively removing a second portion of the SiC layer, the second portion being under the second sidewall insulating film.

11. The manufacturing method of a semiconductor device according to claim 10, wherein wet etching using tetramethylammonium hydroxide is performed at the selectively removing a second portion.

12. The manufacturing method of a semiconductor device according to claim 9, wherein the SiC layer is epitaxially grown in the forming an SiC layer.

13. The manufacturing method of a semiconductor device according to claim 9, wherein the SiGe layer is epitaxially grown in the forming an SiGe layer.

14. The manufacturing method of a semiconductor device according to claim 9, wherein Miller index of the side surface of the second recess at the gate insulating film side is {111}.

15. The manufacturing method of a semiconductor device according to claim 9, further comprising:
    forming a p-type impurity diffusion layer at least partially overlapping with the SiGe layer in the first active region; and
    forming an n-type impurity diffusion layer at least partially overlapping with the SiC layer in the second active region.

16. The manufacturing method of a semiconductor device according to claim 9, further comprising removing the first sidewall insulating film between the forming an SiC layer and the forming a second sidewall insulating film,
    wherein the second sidewall insulating film is thicker than the first sidewall insulating film in a lateral direction.

17. A semiconductor device, comprising:
    a silicon substrate defined into a first active region and a second active region, in which an n-well is formed in the first active region, and a p-well is formed in the second active region;
    a gate insulating film formed on the silicon substrate in the first active region and the second active region;
    a gate electrode formed on the gate insulating film in the first active region and the second active region;
    a sidewall insulating film formed at both lateral sides of the gate electrode in the first active region and the second active region;
    a recess formed at both sides of the gate electrode and at a surface of the silicon substrate in the first active region and the second active region;
    an SiGe layer formed in the recess in the first active region;
    a first SiC layer formed under the sidewall insulating film on the SiGe layer in the first active region; and a second SiC layer formed in the recess in the second active region,
   wherein a side surface of the recess at the gate insulating film side in the first active region is inclined.

18. The semiconductor device according to claim 17, wherein Miller index of the side surface of the recess at the gate insulating film side in the second active region is {111}.

19. The semiconductor device according to claim 17, further comprising:

a p-type impurity diffusion layer formed in the first active region and at least partially overlapping with the SiGe layer; and an n-type impurity diffusion layer formed in the second active region and at least partially overlapping with the SiC layer.

* * * * *